(12) United States Patent
Kim

(10) Patent No.: US 7,442,258 B2
(45) Date of Patent: Oct. 28, 2008

(54) ORGANIC ELECTROLUMINESCENT DEVICE FOR FABRICATING SHADOW MASK

(75) Inventor: Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/829,209

(22) Filed: Apr. 22, 2004

(65) Prior Publication Data

US 2004/0221806 A1 Nov. 11, 2004

(30) Foreign Application Priority Data

May 6, 2003 (KR) .................. 10-2003-0028628

(51) Int. Cl.
B05B 15/04 (2006.01)
C23C 16/04 (2006.01)
C23C 14/04 (2006.01)

(52) U.S. Cl. .............. 118/504; 118/301; 118/720; 313/402

(58) Field of Classification Search .......... 118/504, 118/720, 721, 301, 505, 213; 313/402–403, 313/407, 504; 438/531, 717, 551–553; 204/298.11; 427/282, 66
See application file for complete search history.

(56) References Cited

U.S. PATENT DOCUMENTS

| 4,001,842 | A | * | 1/1977 | Suzuki et al. | ............ 396/547 |
|---|---|---|---|---|---|
| 4,168,450 | A | * | 9/1979 | Yamauchi et al. | ............ 313/403 |
| 4,883,770 | A | | 11/1989 | Dohler et al. | ............ 437/110 |
| 5,079,477 | A | * | 1/1992 | Yamamoto | ............ 313/403 |
| 5,523,647 | A | * | 6/1996 | Kawamura et al. | ............ 313/407 |
| 6,255,775 | B1 | | 7/2001 | Ikuko et al. | ............ 313/506 |
| 6,485,884 | B2 | * | 11/2002 | Wolk et al. | ............ 430/200 |
| 2002/0067117 | A1 | * | 6/2002 | Im et al. | ............ 313/402 |
| 2002/0111035 | A1 | | 8/2002 | Atobe et al. | |
| 2002/0135287 | A1 | | 9/2002 | Fukuzawa et al. | ............ 313/402 |
| 2003/0011299 | A1 | * | 1/2003 | Kim | ............ 313/503 |

FOREIGN PATENT DOCUMENTS

| CN | 1367636 A | 9/2002 |
|---|---|---|
| CN | 1404343 A | 3/2003 |
| WO | WO 03/034471 A1 | 4/2003 |

OTHER PUBLICATIONS

KR 2001087952A Englis Translated Abstract and Figure; Sep. 26, 2001.*

* cited by examiner

*Primary Examiner*—Yewebdar T Tadesse
(74) *Attorney, Agent, or Firm*—Holland & Knight LLP

(57) ABSTRACT

A shadow mask for uniformly forming an organic luminescent layer of an organic electroluminescent device is disclosed. The shadow mask includes a plurality of striped slots aligned in one direction, the striped slots having a plurality of inclined surfaces formed on each side thereof. Due to a step difference, the inclined surfaces prevent shadows from occurring, thereby uniformly forming the organic luminescent layer.

19 Claims, 10 Drawing Sheets

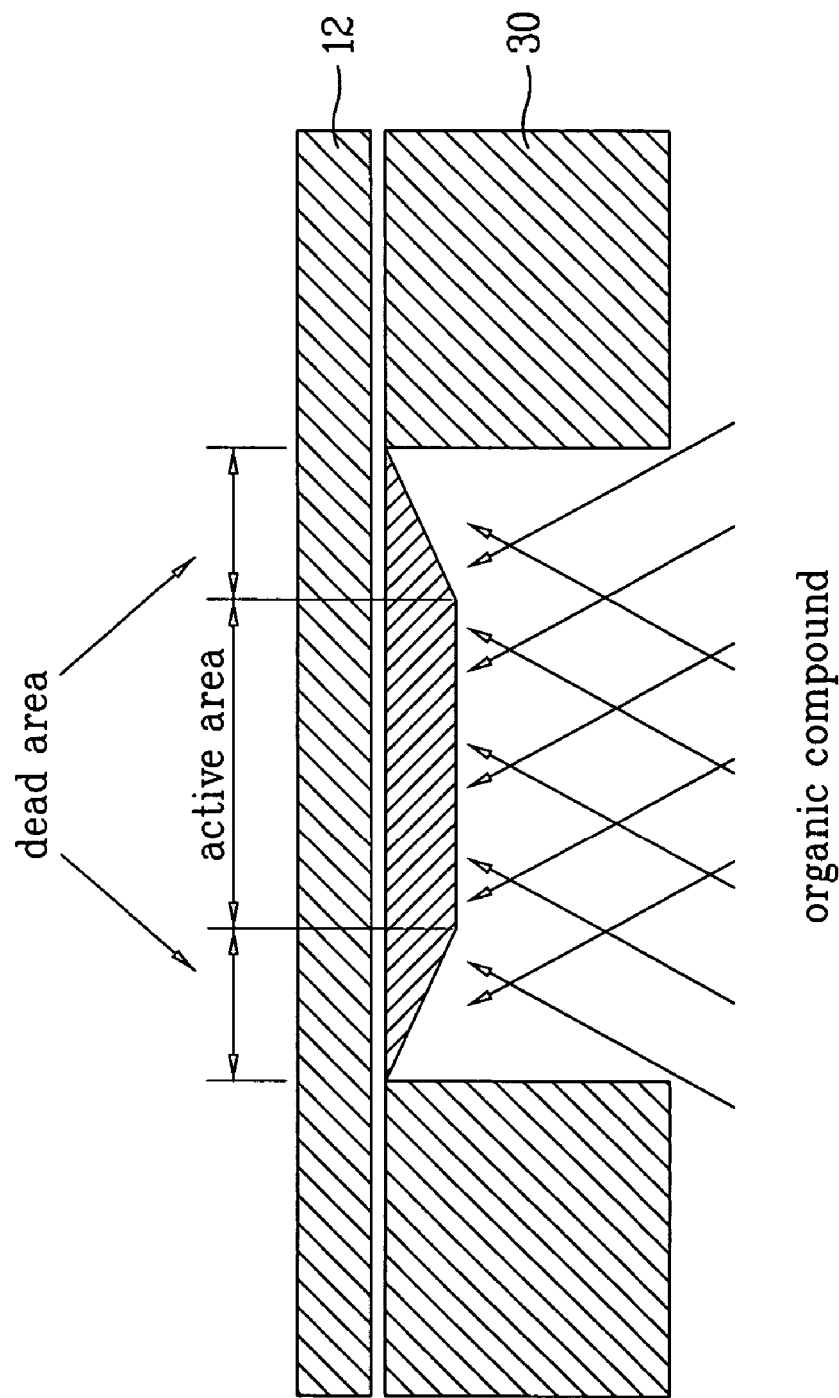

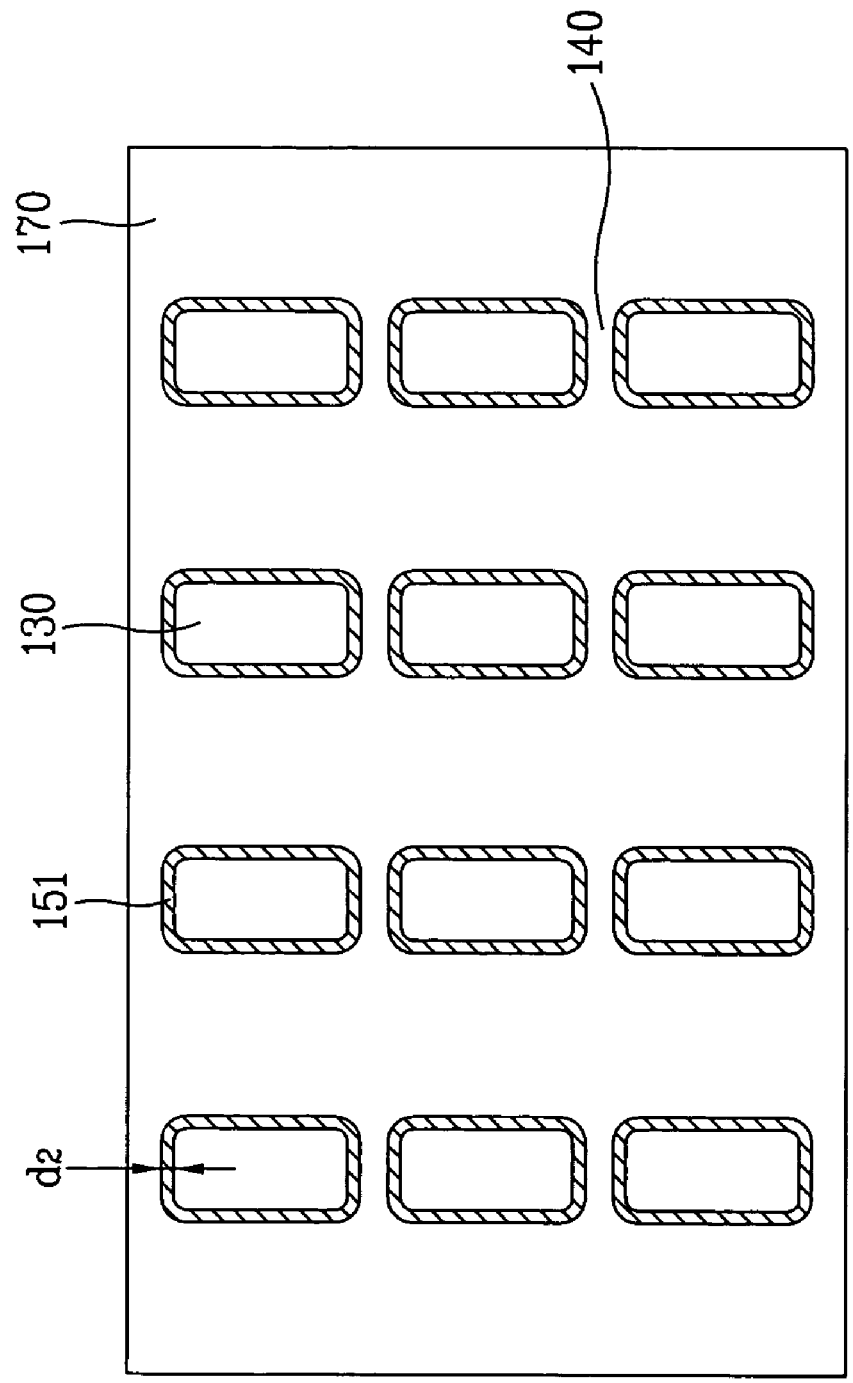

ORGANIC ELECTROLUMINESCENT DEVICE FOR FABRICATING SHADOW MASK

CROSS-REFERENCE TO RELATED APPLICATIONS

This application claims the benefit of Korean Application No. P2003-028628, filed on May 6, 2003, which is hereby incorporated by reference as if fully set forth herein.

BACKGROUND OF THE INVENTION

1. Field of the Invention

The present invention relates to a shadow mask, and more particularly, to an organic electroluminescent device for fabricating a shadow mask. Although the present invention is suitable for a wide scope of applications, it is particularly suitable for minimizing shadows and uniformly depositing an organic compound, thereby fabricating a high-resolution organic electroluminescent device.

2. Discussion of the Related Art

An electroluminescent device is being viewed as a next generation flat display device for its characteristics of a wide viewing angle, a high aperture ratio, and a high chromaticity. More specifically, in an organic electroluminescent (EL) device, when an electric charge is injected into an organic luminescent layer formed between a hole injection electrode and an electron injection electrode, the electron and the hole are paired to each other generating an exciton, the excited state of which falls to a ground state, thereby emitting light. Thus, the organic electroluminescent device (ELD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic luminescent layer on the transparent electrode, and a cathode electrode on the organic luminescent layer. The active matrix ELD is formed of a plurality of scan lines and data lines defining a pixel area on a substrate, a switching device electrically connecting the scan lines and the data lines and controlling the electroluminescent device, a transparent electrode (or anode) electrically connected to the switching device and formed in the pixel area on the substrate, an organic luminescent layer on the transparent electrode, and a metal electrode (or cathode) on the organic luminescent layer. Unlike the passivation ELD, the active matrix ELD further includes the switching device, which is a thin film transistor (TFT).

FIG. 1 illustrates a cross-sectional view of a general organic electroluminescent device. Referring to FIG. 1, an indium-tin-oxide (ITO) electrode 12 is formed on the substrate 11 in a striped form, and insulating layer patterns 15 and barrier ribs 16 are serially formed on the ITO electrode 12. In addition, an organic luminescent layer 13 is formed on the ITO electrode 12, and an anode electrode 14 is formed on the organic luminescent layer 13. Herein, the organic luminescent layer 13 is formed in the pixel area on the ITO electrode 12 by using a shadow mask.

FIGS. 2A and 2B illustrate plane views of a related art shadow mask for fabricating an organic electroluminescent device. Referring to FIG. 2A, the related art shadow mask 20 includes a plurality of slots 21. Each of the slots 21 acts as a pattern for depositing an organic luminescent substance and are aligned with the striped ITO electrodes 12. However, the shadow mask 20 is disadvantageous in that the shadow mask 20 can be easily deformed by stress. The shadow mask 30 shown in FIG. 2B includes a plurality of bridges 32 formed between each slot 31 in order to prevent deformation caused by stress.

The above-described related art shadow masks 20 and 30 result in shadows, as shown in the cross-sectional view of FIG. 3. In other words, the vertical cross-section of the shadow mask 20 and 30 interrupts organic compounds from being deposited on the ITO electrode 12, which is adjacent to the edge of each slot 21 and 31, thereby forming a dead area wherein the desired thickness of the organic compound is not deposited. For such reasons, it is difficult to fabricate a high-resolution electroluminescent device.

SUMMARY OF THE INVENTION

Accordingly, the present invention is directed to an organic electroluminescent device for fabricating a shadow mask that substantially obviates one or more problems due to limitations and disadvantages of the related art.

An object of the present invention is to provide an organic electroluminescent device for fabricating a shadow mask, which prevents a shadow caused by a step difference of the mask when depositing a luminescent layer of the organic electroluminescent device from occurring.

Another object of the present invention is to provide an organic electroluminescent device for fabricating a shadow mask, which enables the luminescent layer to be uniformly deposited.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shadow mask includes a plurality of striped slots aligned in one direction, the striped slots having a plurality of inclined surfaces formed on each side thereof.

The shadow mask further includes a plurality of bridges dividing the striped slots in pixel units. The bridges have a plurality of inclined surfaces formed on each side thereof, and each of the inclined surfaces is formed on each side of each upper portion and lower portion of the bridges.

The inclined surfaces formed on each side of each slot include an upper inclined surface formed on each side of an upper portion of each slot, and a lower inclined surface formed on each side of a lower portion of each slot. Herein, a surface area, a width, and a height of the upper inclined surface are each different from those of the lower inclined surface.

In addition, a width of the upper portion of each slot is different from that of the lower portion of each slot.

In another aspect of the present invention, a shadow mask includes a plurality of pattern holes aligned in one direction, the pattern holes having a plurality of inclined surfaces formed on each side thereof.

Each of the hole patterns has a shape and a size corresponding to a pixel region of the organic electroluminescent device.

The inclined surfaces include an upper inclined surface formed on an upper portion of each hole pattern, and a lower inclined surface formed on a lower portion of each hole pattern. Herein, a surface area, a width, and a height of the upper inclined surface are each different from those of the lower inclined surface.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings;

FIG. 3 illustrates a method for depositing an organic compound by using the related art shadow mask;

FIGS. 5A and 5B illustrate plane views of the shadow mask according to a first embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The method for fabricating an organic electroluminescent device according to the present invention will now be described with reference to the accompanying drawings.

FIGS. 4A to 4F illustrate process steps of a method for depositing an organic compound by using a shadow mask according to the present invention.

Figure 1:
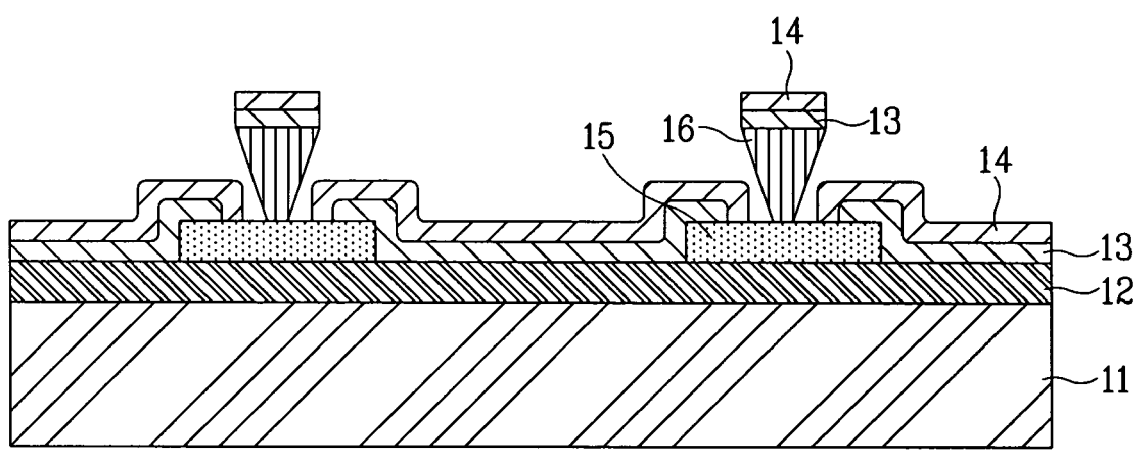
FIG. 1 illustrates a cross-sectional view of a general organic electroluminescent device.
Figure 2A:
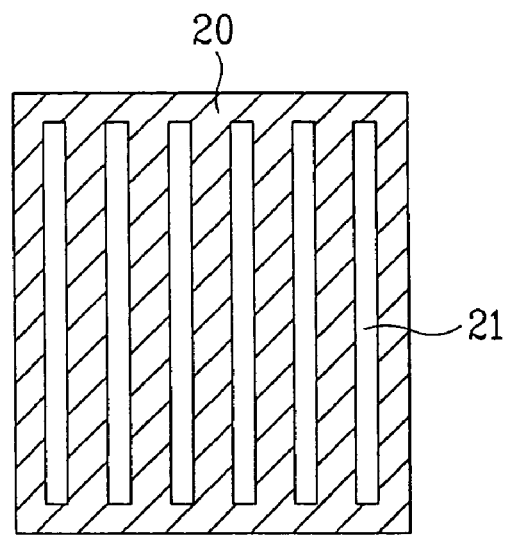
FIGS. 2A and 2B illustrate plane views of a related art shadow mask for fabricating an organic electroluminescent device.
Figure 2B:
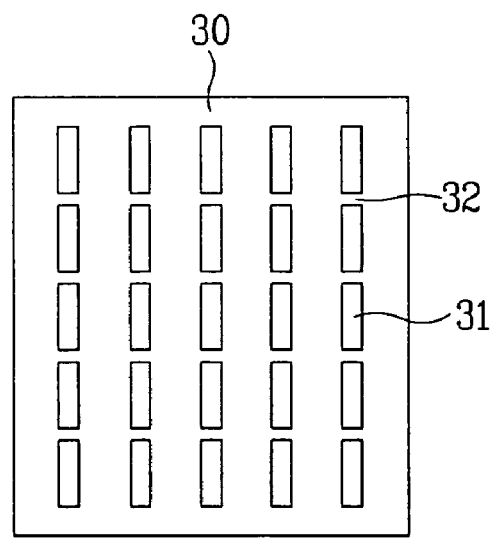
Figure 4A:
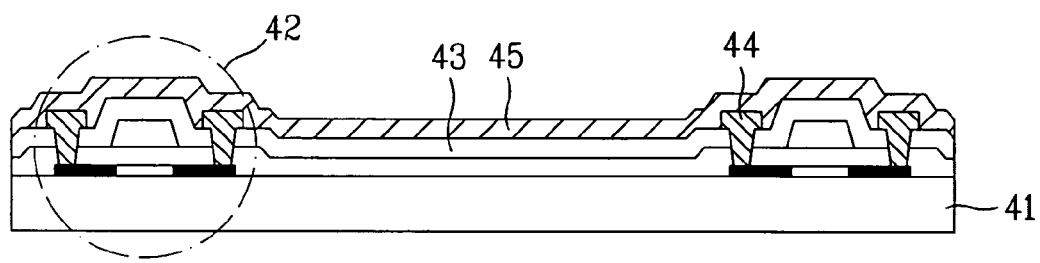
FIGS. 4A to 4F illustrate process steps of a method for depositing an organic compound by using a shadow mask according to the present invention.

Referring to FIG. 4A, a thin film transistor 42 is formed on a glass substrate 41. The thin film transistor 42 includes source and drain areas, channel areas, a gate insulating layer, and gate electrodes. Subsequently, an interlayer dielectric 43 is formed on the gate insulating layer and the gate electrodes. Then, the interlayer dielectric 43 and the gate insulating layer are selectively etched to form a plurality of contact holes, so as to expose a predetermined portion of the upper surface of the source and drain areas. The contact holes are filled with metal so as to form a plurality of electrode lines 44, each connected to the source and drain areas. An insulating layer 45 can be further deposited on the interlayer dielectric 43 and the electrode lines 44.

Figure 4B:
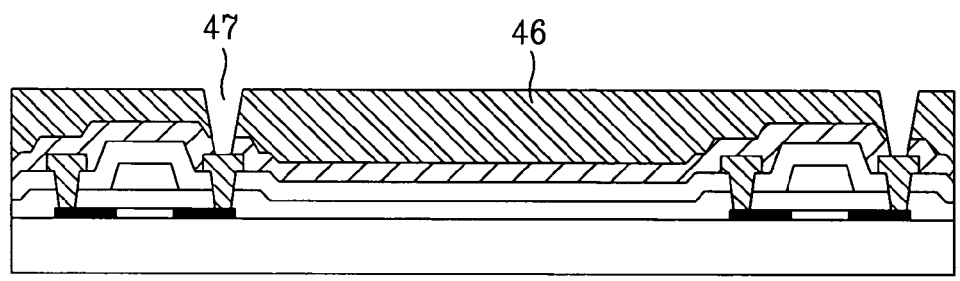

As shown in FIG. 4B, an insulating material is deposited on the interlayer dielectric 43 and the electrodes lines 44 by a spin-coating method, and a planarized insulating layer 46 is deposited thereon. Then, the planarized insulating layer 46 is hardened by a pre-baking process. Subsequently, the planarized insulating layer 46 is selectively removed so as to form a plurality of via holes 47, thereby exposing the electrode lines 44 connected to the drain area of the thin film transistor 42.

Figure 4C:
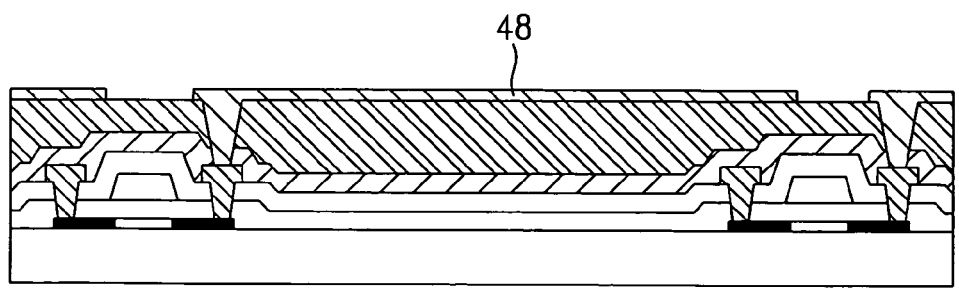

Referring to FIG. 4C, a metal for forming a plurality of pixel electrodes 48 is deposited on the entire surface of the via holes 47 and the planarized insulating layer 47. Herein, when using a bottom-emission EL device, the metal layer is formed of a transparent material, such as ITO. Conversely, when using a top-emission EL device, the metal layer is formed of a substance with high reflexibility and high work function. The metal layer deposited within the via holes 47 of the planarized insulating layer 47 is connected to the electrode line 44 at the bottom of the via holes 47.

Figure 4D:
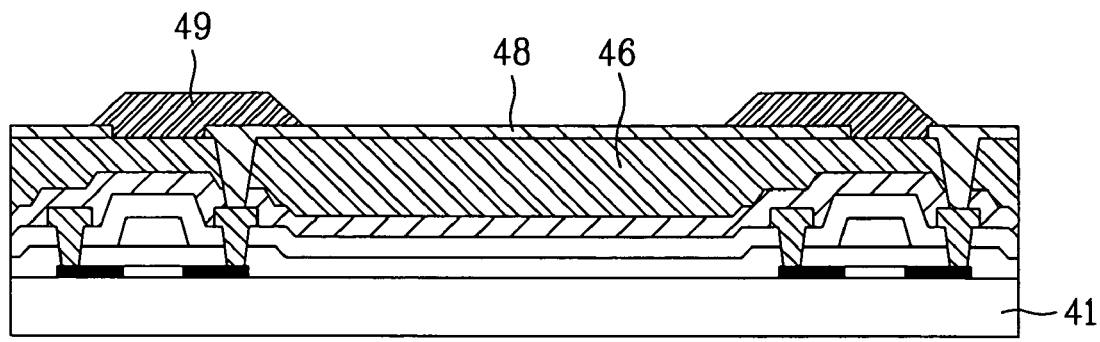

As shown in FIG. 4D, after depositing the insulating material on the entire surface, the insulating layer is selectively removed to form an insulating layer 49 at the remaining area excluding the pixel areas, more specifically, the boundary area between each pixel area. At this point, the insulating layer 49 is formed on a predetermined portion of the pixel electrode 48 and the planarized insulating layer 47. A counter electrode (not shown) electrically connected to a common electrode 51 may also be formed on the insulating layer 49.

Figure 4E:
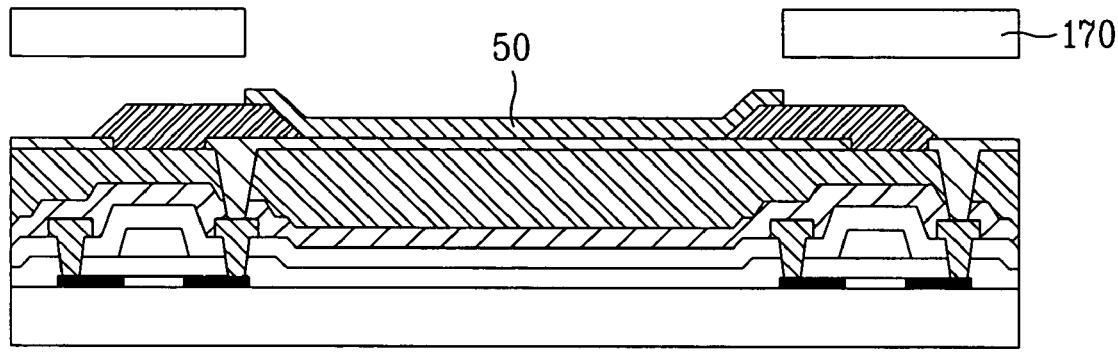

Subsequently, referring to FIG. 4E, an organic electroluminescent layer 50 is deposited on the pixel electrode 48 by using the shadow mask 170. The organic electroluminescent layer 50 is classified into a red (R) organic electroluminescent layer, a green (G) organic electroluminescent layer, and a blue (B) organic electroluminescent layer depending upon the emitted color. And, the R, G, and B electroluminescent layers are serially formed in the corresponding pixel area. The electroluminescent layer 50 is deposited only in the pixel area. Herein, a hole injecting layer (not shown) and a hole transmitting layer (not shown), injecting and transmitting holes supplied from the pixel electrodes 48 into the organic electroluminescent layer 50, respectively, are formed on the lower surface of the organic electroluminescent layer 50. And, an electron injecting layer (not shown) and an electron transmitting layer (not shown), injecting and transmitting electrons supplied from the common electrode 51, respectively, are formed on the upper surface of the organic electroluminescent layer 50.

Figure 4F:
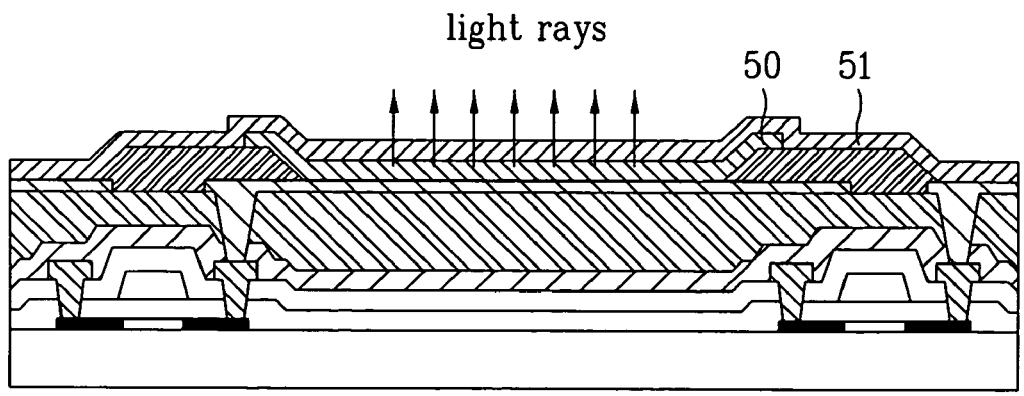

Furthermore, as shown in FIG. 4F, a common electrode 51 is formed on the organic electroluminescent layer 50 and the insulating layer 49. Since the common electrode 51 is electrically connected to the counter electrode, the electric current flowing through the common electrode 51 is then sent to the counter electrode having a low resistance. Although it is not shown in the drawings, a passivation layer (not shown) is formed on the organic electroluminescent layer 50 so as to protect the layer from oxygen or humidity. Also, a protective cap is formed by using a sealant and a transparent substrate.

The shadow mask used to fabricate the organic electroluminescent layer 50 will now be described as follows.

First Embodiment

Figure 5A:
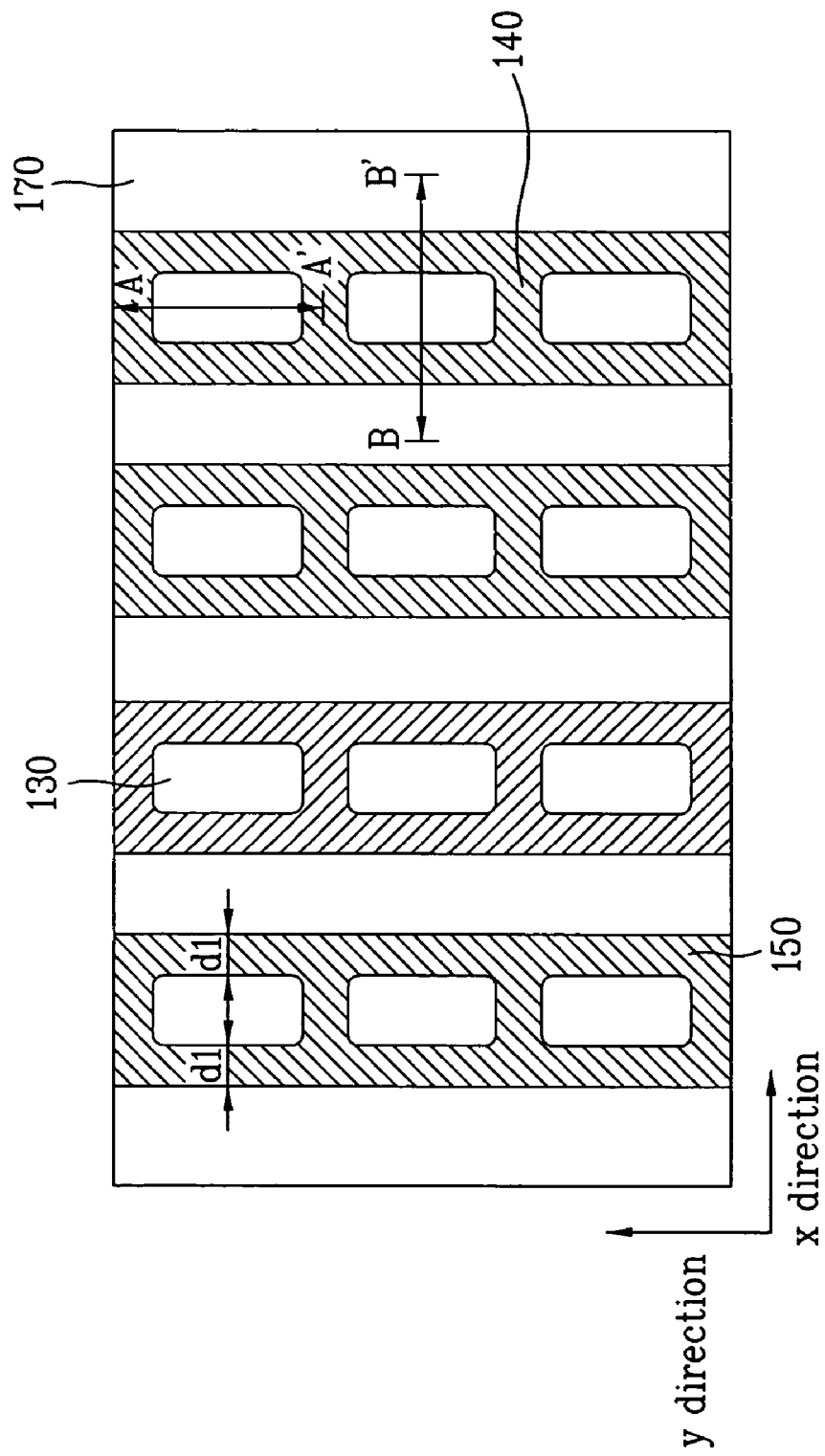

FIGS. 5A and 5B illustrate plane views of the shadow mask according to a first embodiment of the present invention, wherein FIG. 5A illustrates the upper surface of the shadow mask 170 and FIG. 5B illustrates the lower surface thereof.

Referring to FIGS. 5A and 5B, the shadow mask 170 includes a plurality of striped slots aligned in one direction, and also includes an inclined surface 150 and 151 on each side of the striped slots. A plurality of bridges 140 each divides the striped slots into pixel units. And, the divided slots 130 are aligned in an x-direction (row) and a y-direction (column).

Figure 6A:
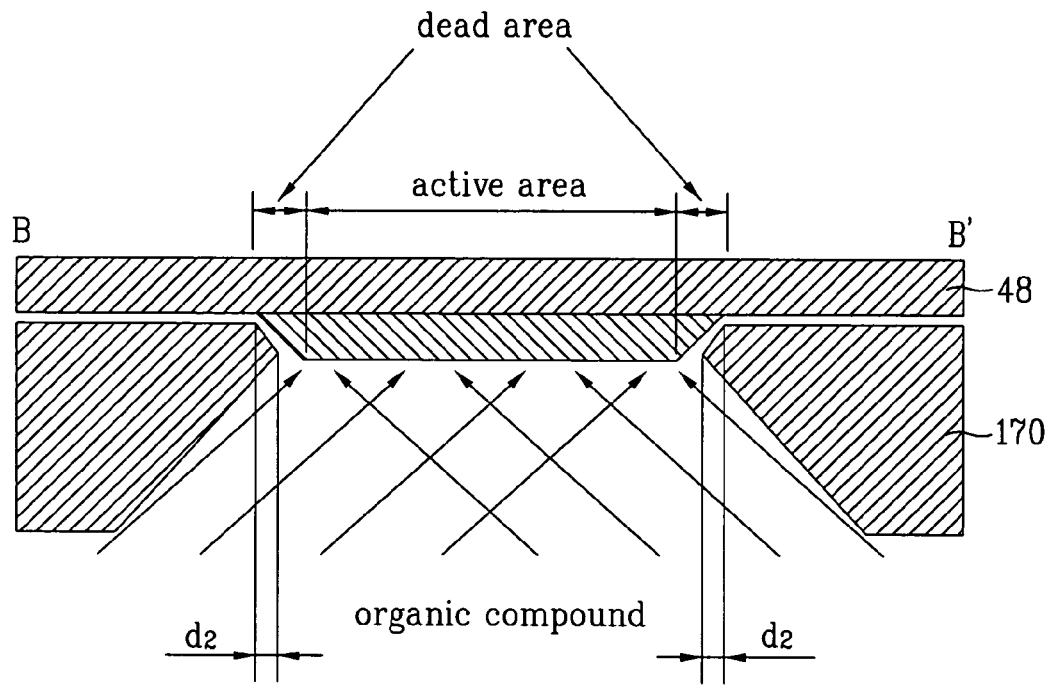
FIG. 6A illustrates a cross-sectional view taken along lone B-B' of FIG. 5A.

FIG. 6A illustrates a method for depositing an organic compound on the substrate or the pixel electrode 48 by using the shadow mask 170. As shown in FIG. 6A, the shadow mask 170 has a plurality of inclined surfaces 150 and 151 around the slots 130. More specifically, an upper inclined surface 150 and a lower inclined surface 151 are respectively formed on the upper portion and the lower portion of the shadow mask 170 at each side of the slots 130. The surface area, the width (d1), and the height of the upper inclined surface 150 are different from those of the lower inclined surface 151. With respect to the surface area, width, and height, the upper inclined surface 150 is larger than the lower inclined surface 151. Also, the width of the upper slots 130 is larger than that of the lower slots 130. The above-described upper and lower inclined surfaces 150 and 151 can be formed by a wet-etching method.

Figure 6B:
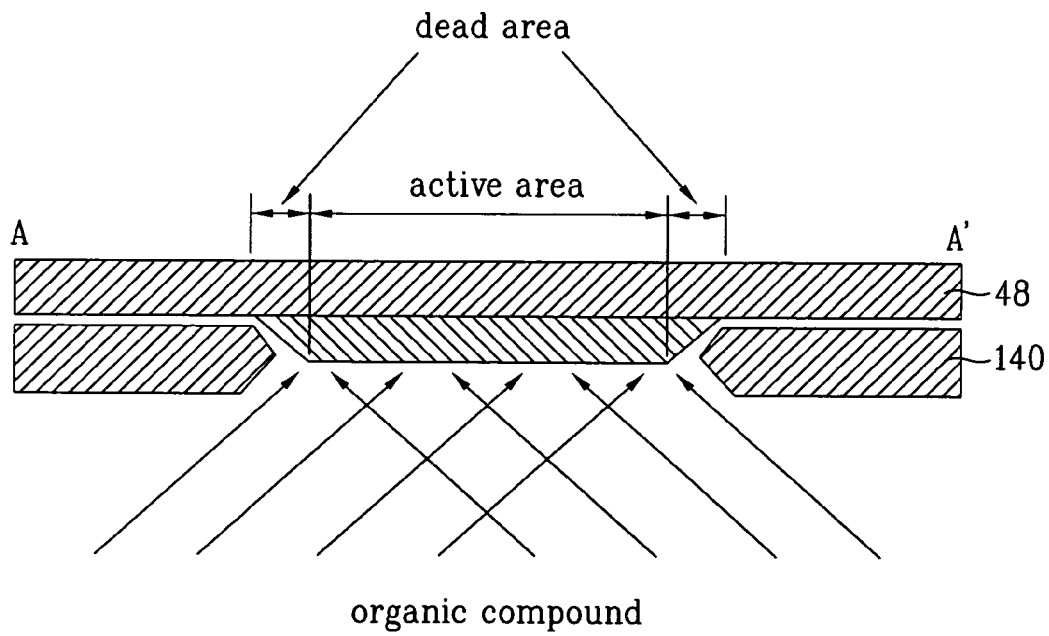
FIG. 6B illustrates a cross-sectional view taken along line A-A' of FIG. 5A.

Referring to FIG. 6B, a plurality of inclined surfaces are formed on each side of the bridges 140. The inclined surfaces are formed on the upper and lower portions of each side of the bridges. The thickness of the bridge 140 is formed thinner than that of the area of the shadow mask 170 area having no inclined surface 150 and 151.

As described above, the shadow mask 170 according to the present invention can minimize shadows from occurring upon deposition of the organic compound, due to the inclined surfaces formed around the slots 130. Thus, the dead area is reduced, and the active area is increased.

Second Embodiment

Figure 7A:
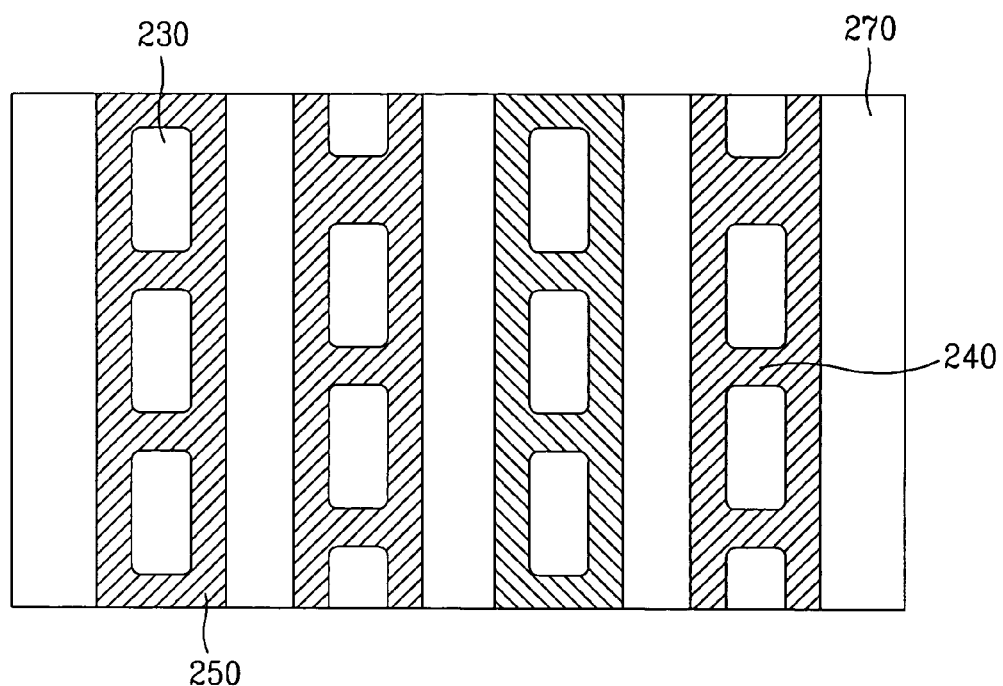
FIGS. 7A and 7B illustrate plane views of the shadow mask according to a second embodiment of the present invention.
Figure 7B:
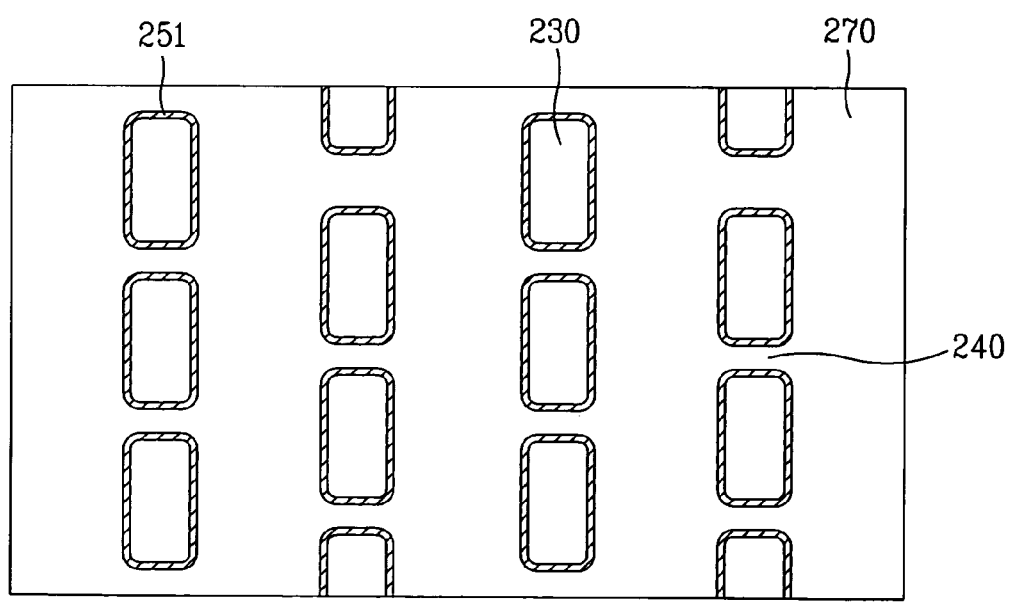

FIGS. 7A and 7B illustrate plane views of the shadow mask according to a second embodiment of the present invention, wherein FIG. 7A illustrates the upper surface of the shadow mask 270 and FIG. 7B illustrates the lower surface thereof.

Referring to FIGS. 7A and 7B, the shadow mask 270 includes a plurality of striped slots aligned in one direction, and also includes an inclined surface 250 and 251 on each side of the striped slots. A plurality of bridges 240 each divides the striped slots into pixel units. However, the alignment of the divided slots 230 is different from that of the first embodiment. More specifically, the slot 230 of an odd-numbered column and the slot 230 of the even-numbered column are aligned differently from one another. With the exception of the alignment of the slots 230, the second embodiment has the same structure as that of the first embodiment of the present invention.

Third Embodiment

Figure 8A:
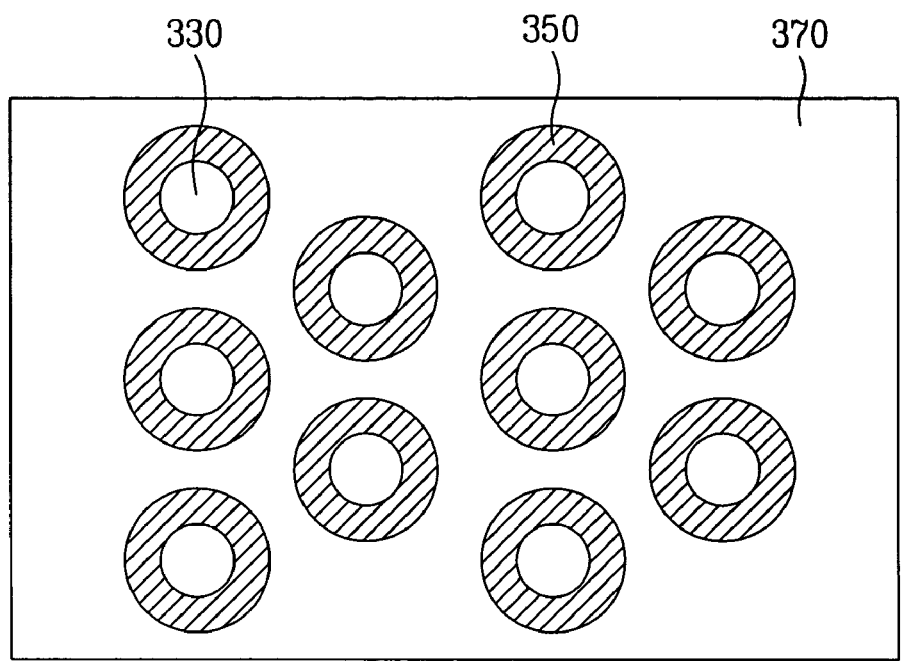
FIGS. 8A and 8B illustrate plane views of the shadow mask according to a third embodiment of the present invention.
Figure 8B:
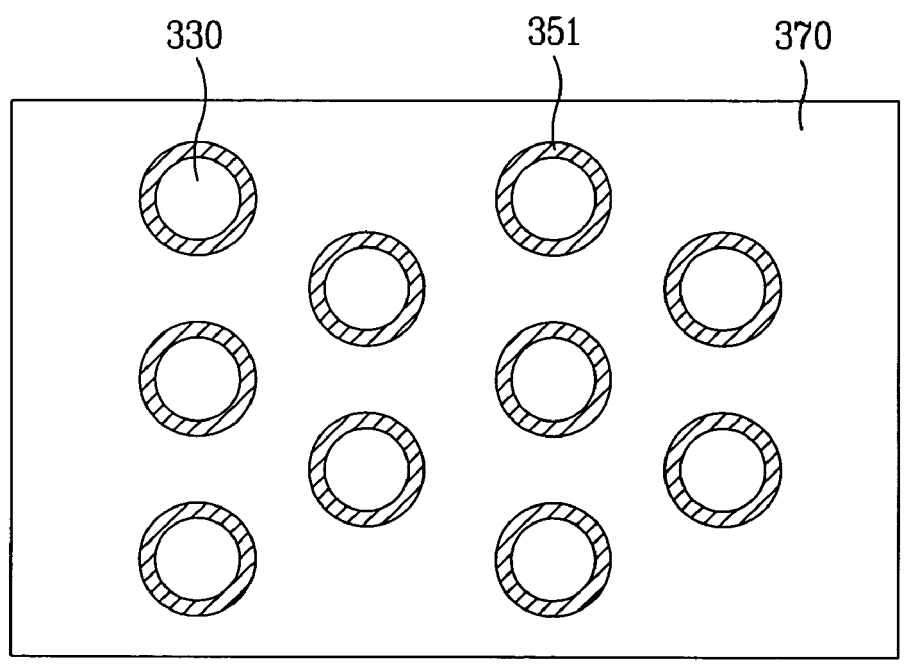

FIGS. 8A and 8B illustrate plane views of the shadow mask according to a third embodiment of the present invention, wherein FIG. 8A illustrates the upper surface of the shadow mask 370 and FIG. 8B illustrates the lower surface thereof.

Referring to FIGS. 8A and 8B, the shadow mask 370 includes a plurality of hole patterns 330 aligned in one direction. The shape and size of each hole pattern 330 corresponds to the pixel area of the organic electroluminescent device. Depending upon the shape of the pixel area, the shape of the hole patterns 330 can be formed either in a circle or in a polygonal shape.

A plurality of inclined surfaces 350 and 351 are formed in the shadow mask 370 area surrounding the hole pattern 330. More specifically, an upper inclined surface 350 and a lower inclined surface 351 are respectively formed on the upper portion and the lower portion of the shadow mask 370.

The surface area, the width (d1), and the height of the upper inclined surface 350 are different from those of the lower inclined surface 351. With respect to the surface area, width, and height, the upper inclined surface 350 is larger than the lower inclined surface 351. Also, the widths of the upper hole patterns 330 and the lower hole patterns 330, in other words, the upper width is larger than the lower width.

In the shadow mask according to the present invention, inclined surfaces are formed around the slots and the hole patterns, thereby minimizing shadows and allowing the organic compound to be uniformly deposited on the substrate or the pixel electrode. Thus, an accurate organic electroluminescent layer pattern can be formed, so as to fabricate and produce a high-resolution organic electroluminescent device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mask for use during deposition of a luminescent layer of an organic electroluminescent device, the mask comprising:
    a plurality of holes aligned uniformly and in parallel to each other along an axis of the mask, wherein an entire inner circumferential edge of the plurality of holes is formed by first and second angled surfaces, and wherein each of the plurality of holes has a shape and a size corresponding to a pixel region of the organic electroluminescent device such that each of the plurality of holes is configured to block an adjacent sub-pixel area during deposition of an organic electroluminescent material during fabrication of an organic electroluminescent device; and
    a plurality of bridges, wherein one of the plurality of bridges extends between respective ends of adjacent holes of the plurality of holes, wherein a thickness of each of the plurality of bridges is less than a thickness of the mask in areas of the mask having no angled surface portions,
    wherein the first angled surface extends from an upper surface portion of the mask that defines its respective hole toward an interior portion of its respective hole, and the second angled surface extends from a distal end of the first angled surface to a lower surface portion of the mask that defines its respective hole.

2. The mask according to claim 1, wherein the plurality of holes are circular, polygonal, oval, or rectangular.

3. The mask according to claim 1, wherein a width of each of the plurality of holes is greater at its upper and lower circumferential edges than a corresponding width of each of the plurality of holes at a portion where the first and second angled surface meet.

4. The mask according to claim 1, wherein the first and second angled surfaces each extend uniformly along the entire inner circumferential edge of each hole.

5. A mask for use during deposition of a luminescent layer of an organic electroluminescent device, the mask comprising:
    a plurality of strip-type slots aligned uniformly and in parallel to each other along an axis of the mask, wherein an alignment of a first row of the plurality of strip-type slots is different from an alignment of a second row of the plurality of strip-type slots, wherein the plurality of strip-type slots are arranged so as to block adjacent deposition area during deposition of material during fabrication of an organic electroluminescent device; and a first angled surface and a second angled surface that defines an inner circumferential edge of each the plurality of strip-type slots, wherein the first angled surface extends uniformly along an entire upper inner circumferential edge of each of the plurality of strip-type slots, and the second angled surface extends uniformly along an entire lower inner circumferential edge of each of the plurality of strip-type slots.

6. The mask according to claim 5, wherein a shape of the inner circumferential edge defined by the first and second angled surfaces is symmetric on opposing sides of the strip-type slots.

7. The mask according to claim 6, wherein opposing sides of each of the strip-type slots are perpendicular to a side of a corresponding side of the strip-type slots adjacent to a bridge of the plurality of bridges.

8. The mask according to claim 6, wherein a surface area of the first angled surface is substantially the same as a surface area of the second angled surface.

9. The mask according to claim 6, wherein a surface area of the first angled surface is different from a surface area of the second angled surface.

10. The mask according to claim 6, wherein a width and a height of the first angled surface are the same as a width and a height of the second angled surface.

11. The mask according to claim 6, wherein a width and a height of the first angled surface are different from a width and a height of the second angled surface.

12. The mask according to claim 5, wherein the axis is an x-axis.

13. The mask according to claim 5, wherein the axis is a y-axis.

14. The mask according to claim 5, wherein the first row of strip-type slots is adjacent to the second row of strip-type slots such that the strip-type slots positioned in the first row are parallel to the strip-type slots in the second row, and the strip-type slots positioned in the first row are staggered relative to the strip-type slots positioned in the second row.

15. The mask according to claim 5, wherein an alignment of the strip-type slots is the same for alternating rows.

16. The mask according to claim 5, wherein a shapes of the strip-type slots is rectangular, oval, polygonal, or circular.

17. The mask according to claim 5, wherein the areas of the mask positioned between adjacent slots comprise bridges extending between the adjacent holes.

18. The mask according to claim 17, wherein the each slots has an angled surface formed along its full inner perimeter surface.

19. The mask according to claim 5, wherein a width of each of the plurality of strip-type slots is greater at its upper and lower circumferential edges than a corresponding width of each of the plurality of strip-type slots at a portion where the first and second angled surface meet.

* * * * *